United States Patent
Rogers et al.

(10) Patent No.: US 7,612,284 B2
(45) Date of Patent: Nov. 3, 2009

(54) SPACE-BASED POWER SYSTEM

(75) Inventors: James E. Rogers, Hermosa Beach, CA (US); Gary T. Spirnak, Manhattan Beach, CA (US)

(73) Assignee: Solaren Corporation, Manhattan Beach, CA (US)

( * ) Notice: Subject to any disclaimer, the term of this patent is extended or adjusted under 35 U.S.C. 154(b) by 304 days.

(21) Appl. No.: 11/212,824

(22) Filed: Aug. 25, 2005

(65) Prior Publication Data

US 2006/0185726 A1    Aug. 24, 2006

Related U.S. Application Data

(63) Continuation of application No. 10/724,310, filed on Nov. 26, 2003, now Pat. No. 6,936,760.

(60) Provisional application No. 60/428,928, filed on Nov. 26, 2002.

(51) Int. Cl.
*H01L 31/042* (2006.01)
(52) U.S. Cl. .................................. 136/246; 136/292
(58) Field of Classification Search ................ 244/1; 322/2, 21; 342/356; 455/12.1
See application file for complete search history.

(56) References Cited

U.S. PATENT DOCUMENTS

| | | | |
|---|---|---|---|
| 3,114,517 A | 12/1963 | Brown | |
| 3,174,705 A | 3/1965 | Schiff et al. | |
| 3,378,845 A | 4/1968 | Welber | |
| 3,434,678 A | 3/1969 | Brown et al. | |
| 3,453,633 A * | 7/1969 | Phillips | 343/779 |
| 3,535,543 A | 10/1970 | Dailey | |
| 3,705,406 A * | 12/1972 | Fletcher et al. | 343/782 |
| 3,781,647 A | 12/1973 | Glaser | |
| 3,933,323 A | 1/1976 | Dudley et al. | |
| 3,989,994 A | 11/1976 | Brown | |
| 4,078,747 A | 3/1978 | Minovitch | |
| 4,187,506 A | 2/1980 | Dickinson | |
| 4,251,679 A | 2/1981 | Zwan | |
| 4,305,555 A | 12/1981 | Davis | |
| 4,368,415 A | 1/1983 | Henderson et al. | |
| 4,371,135 A | 2/1983 | Keigler | |
| 4,490,668 A | 12/1984 | Sterzer | |
| 5,019,768 A | 5/1991 | Criswell et al. | |
| 5,223,781 A | 6/1993 | Criswell et al. | |
| 5,260,639 A | 11/1993 | DeYoung | |
| 6,407,535 B1 | 6/2002 | Friedman et al. | |
| 6,725,012 B1 * | 4/2004 | Janson et al. | 455/12.1 |
| 6,936,760 B2 * | 8/2005 | Rogers et al. | 136/246 |
| 2001/0035207 A1 | 11/2001 | Mikami et al. | |
| 2003/0098058 A1 | 5/2003 | Takada et al. | |

FOREIGN PATENT DOCUMENTS

EP    1149764    10/2001

(Continued)

OTHER PUBLICATIONS

Office Action (U.S. Appl. No. 10/724,310)—Jul. 15, 2004.

(Continued)

*Primary Examiner*—Kaj K Olsen
*Assistant Examiner*—Bach T Dinh
(74) *Attorney, Agent, or Firm*—Vista IP Law Group LLP

(57) ABSTRACT

A space-based power system. The system maintains proper positioning and alignment of system components without using connecting structures. Power system elements are launched into orbit, and the free-floating power system elements are maintained in proper relative alignment, e.g., position, orientation, and shape, using a control system.

25 Claims, 18 Drawing Sheets

FOREIGN PATENT DOCUMENTS

| EP | 1189329 | 3/2002 |
|---|---|---|
| JP | 2000-264299 | 9/2000 |
| JP | 2001-309581 | 11/2001 |
| JP | 2002-095190 | 3/2002 |

OTHER PUBLICATIONS

Notice of Allowance (U.S. Appl. No. 10/724,310)—Nov. 16, 2004.

Office Action (IN App. No. 1171/KOLNP/2005)—Mar. 30, 2007 (2 pages).

http://www.nasa.gov/mission_pages/station/main/index.html (printed on May 23, 2007) (3 pages).

http://en.wikipedia.org/wiki/Sattelite (printed on May 23, 2007) (10 pages).

http://en.wikipedia.org/wiki/Solar_power_satellite (printed on May 23, 2007) (14 pages).

Fukada, Takahiro, "Japan Plans to Launch Solar Power Station In Space By 2040," Jan. 31, 2001,http://www.spacedaily.com/news/ssp-01a.html (printed May 23, 2007) (3 pages).

D.P. Ahuja & Co., May 31, 2007 response to Mar. 30, 2007 Office Action, India Application No. 1171/KOLNP/2005, corresponding to PCT App. No. PCT/US2003/03806.

Translation (provided by RU Associate) of Office Action in RU Application No. 2005120149, based on PCT/US2003/038006 in the name of Solaren Corporation (2 pages).

Text of the Second Office Action (Translation) for CN Application No. 2003801092481, Applicant Solaren Corporation, dated Aug. 22, 2008 (5 pages).

Translation of Office Action dated Sep. 29, 2008 in RU Application No. 2005120149, based on PCT/US2003/038006 (WO2004/049538) in the Name of Solaren Corporation, 2 pages.

Krafft A. Ehricke, "the Future of the Space Industry", pp. 72-73, 86-87, 100-10, dated 1979, translation only. (5 pages).

Papers from file history of related RU patent application No. 2005120149, based on PCT/US2003/038006 (WO2004/049538) in the Name of Solaren Corporation including: Final Rejection dated Mar. 29, 2009, in Russian language with a translation provided by foreign associate. (9 pages).

Notice of Allowance from related CN patent application No. 200380109248.1 dated Mar. 27, 2009, translation only, provided by Chinese associate. (2 pages).

Office Action for related JP patent application No. 2004-555811 mailing date Jun. 24, 2009, in Japanese language with translation provided by Japanese associate. (9 pages).

Matsumoto, Soichi et al. Space-based Solar Power System "SOLARBIRD" "TeleEnergy" (translated title from Japanese associate), EMC (Electro Magnetic Compatiblity), Japan, 2002, Nov. 5, vol. 15, No. 7, pp. 113-119. No English Language translation provided. (7 pages).

* cited by examiner

B-B

SPACE-BASED POWER SYSTEM

CROSS-REFERENCE TO RELATED APPLICATION(S)

This application is a continuation of U.S. application Ser. No. 10/724,310, filed Nov. 26, 2003, now U.S. Pat. No. 6,936,760, which claims priority under 35 U.S.C. §119 to Provisional Application No. 60/428,928, filed Nov. 26, 2002, the contents of which are incorporated herein by reference.

FIELD OF THE INVENTION

The present invention relates to power systems, and more particularly, to space-based power systems with free-floating components that can be aligned.

DESCRIPTION OF RELATED ART

Spaced-based power systems use the Sun's radiant power or solar flux to generate energy. The Sun's solar constant or flux is approximately 1.4 kW/m$^2$ in earth orbit. For example, in geosynchronous orbit or GEO (22,400 miles or 36,000 km from Earth), a space solar power system is almost continuously immersed in sunlight.

Solar cells, solar conversion devices, and nuclear power devices on a space power system generate Direct Current (DC) electricity, which is converted to a transmission frequency, such as radio, microwave and laser frequencies. For example, with Radio Frequency (RF) and microwaves, the generated electricity is converted to power through conversion devices, e.g. magnetrons, and focused by an antenna. The focused energy is directed to a receiver, and a receive antenna ("rectenna") converts the power beam into DC electricity. The DC electricity is converted into Alternating Current (AC) electricity, which is transmitted to a power grid for distribution to users.

As a result, some percentage of the solar constant is converted into usable electricity. For example, a 1 m$^2$ solar array with a conversion efficiency of 40% can produce about 560 watts of electrical power. One million square meters or a one square kilometer 40% efficient solar array can generate about 560 megawatts (MW) of power.

Concepts to harness solar energy were initially developed in the 1960s. In the 1970s and 1980s, NASA and the Department of Energy conducted satellite system studies, but the low efficiency and high costs of these systems precluded their effectiveness. In the 1990s, NASA conducted further studies and developed new concepts in different orbits. The new systems made improvements relative to earlier studies, however, existing concepts were still not economically viable.

A typical space power system has a power generation subsystem for energy conversion and a wireless power transmission subsystem. Known systems that use photovoltaic cells typically utilize large solar arrays to convert solar energy into electricity. Connecting structures are typically used to maintain the correct relative positions of the system components.

Conventional space power systems can thus be improved. In particular, the connecting structures between power system components can be reduced or eliminated in order to reduce the weight of the system. In conventional systems, the connecting structures can comprise a majority of the weight of the systems. For example, some known systems utilize a transmit antenna in space having connecting structures that are many kilometers long and weigh millions of metric tons. The excessive weight of connecting structures can result in increased launch costs. Further, the excessive weight can strain system components, possibly impacting the alignment, operation and performance of the system. Thus, the weight of electrical and mechanical connections can be a limitation on the maximum size system that can be profitably implemented. Further, the positioning, orientation, and efficiency of system components can be improved, particularly system components that are not linked together with connecting elements.

SUMMARY OF THE INVENTION

In one embodiment, a space-based power system includes a plurality of power system elements in space and a control system. One or more of the power system elements are free-floating in space. The control system maintains alignment of the free-floating elements. The plurality of elements are arranged to collect sunlight, generate electrical energy from the collected sunlight, and convert the electrical energy into a form that can be transmitted to a pre-determined location.

In another embodiment, a space-based power system includes a plurality of power system elements in space and a control system. One or more elements of the plurality of elements are free-floating in space. The power system elements include a primary mirror, an intermediate mirror, a power module, an emitter, and a reflective mirror. The primary mirror directs sunlight to the intermediate mirror. The intermediate mirror directs sunlight to the power module, which generates direct current electricity. The emitter converts the direct current electricity into RF or optical energy, and the reflective mirror transmits the RF or optical energy to a receiver at a predetermined location. The control system includes a plurality of sensors and a plurality of displacement members. Each element in space includes a sensor and a displacement element, and the control system maintains alignment of the free-floating elements in space by selectively activating a displacement member in response to sensor data.

A further embodiment is directed to a method of aligning power system elements to generate power in space and transmit the generated power to a predetermined location. The embodiment includes launching a plurality of elements and a control system into space, in which one or more elements of the plurality of elements are free-floating in space, positioning the elements in space, maintaining alignment of the free-floating elements using the control system so that the power system elements are configured to collect sunlight, generate electrical energy from the collected sunlight, and convert the electrical energy into a form suitable for transmission to the pre-determined location.

In system and method embodiments, the power system elements can have different mirrors and mirror configurations, e.g., a foldable mirror, a spherical mirror, a mirror supported by an inflatable tube or a membrane, mirrors having optical coatings to reduce photon pressure or maintain the shape of the mirror. The power system elements can include a primary mirror, a first intermediate mirror, a power module, an emitter, and a reflective mirror. The first intermediate mirror directs sunlight to the power module, and the power module generates electrical energy. The emitter converts the generated electrical energy into a form that can be transmitted and provides it to the reflective mirror, which transmits the converted energy to a receiver at the predetermined location. Also with system and method embodiments, a concentrator is used to focus the sunlight from the intermediate mirror onto the power module.

System and method embodiments can utilize different power modules, e.g., photovoltaic and thermoelectric power modules. With photovoltaic modules, the solar cells can be co-located with the emitter. The converted energy or energy that is transmitted can be radio frequency or optical energy.

The control system in system and method embodiments can adjust an alignment of one or more system elements by adjusting a position, orientation of the elements. The system includes a plurality of sensors, such as alignment or distance sensors. Data of sensors of two elements is compared to determine whether the two elements are properly aligned and located at an acceptable distance using, for example, radar, lidar, interference patterns, a solar wind, electro-static forces. It also adjusts the alignment of the elements. The control system can include a displacement element, such as a thruster, to adjust the alignment of a system component. Also in system and method embodiments, different numbers of elements, e.g., a majority or all of the elements, are free-floating in space.

BRIEF DESCRIPTION OF THE DRAWINGS

Referring now to the drawings, in which like reference numbers represent corresponding parts throughout, and in which.

DETAILED DESCRIPTION OF ILLUSTRATED EMBODIMENTS

Embodiments of a space-based power system with one or more free-floating or free-flying system components that can be aligned will now be described. The embodiments include components that can be aligned while substantially reducing or eliminating connecting structures between system components, and using a control system to provide for alignment and positioning of free-floating system components.

Figure 1A:
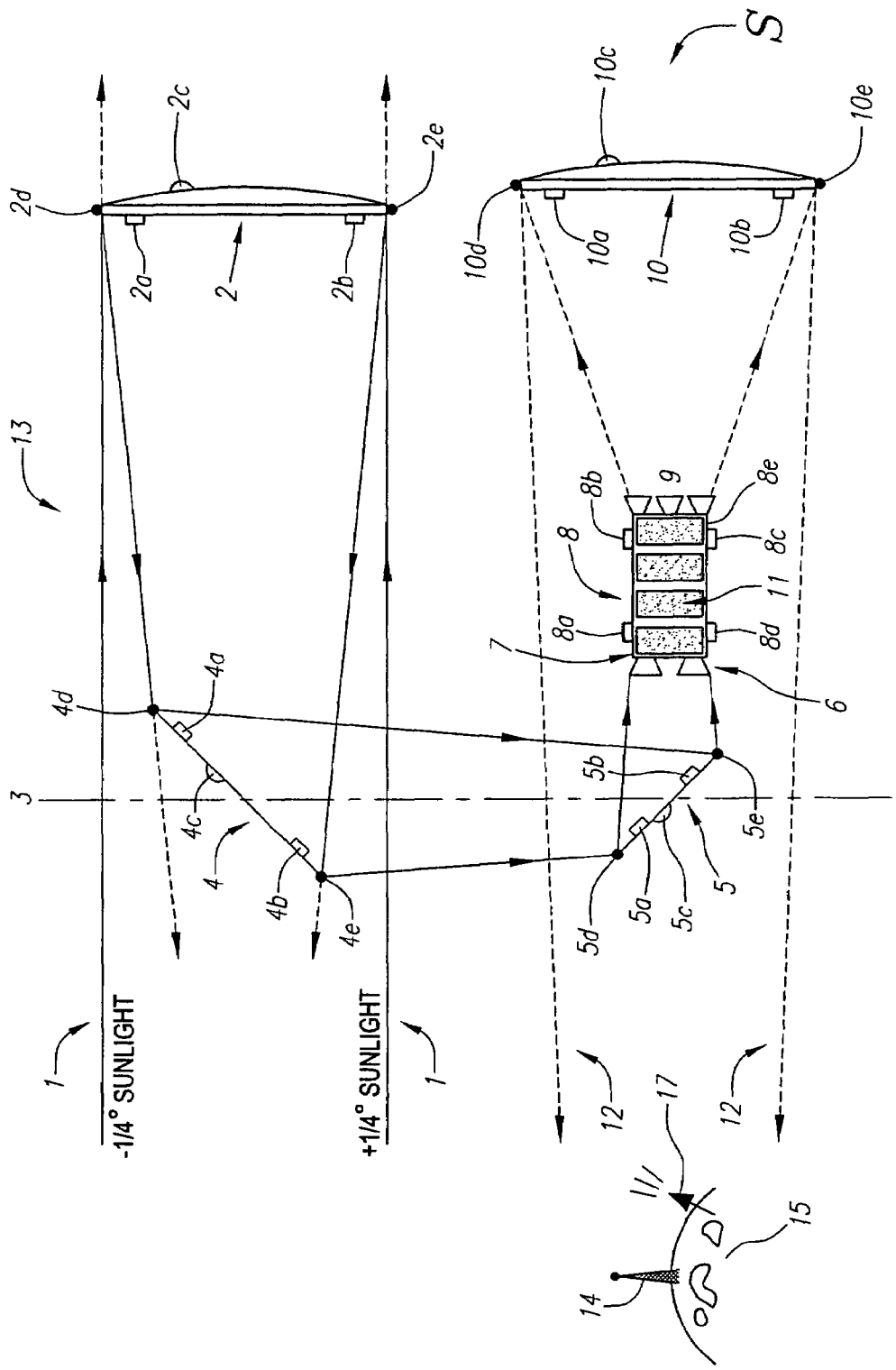
FIG. 1A illustrates an embodiment of a spaced-based power system with free-floating components.

Referring to FIG. 1A, one embodiment of a space-based power system "S" includes power generation and transmission components. One embodiment of a system includes a primary or collection mirror 2, which orbits about axis 3, intermediate mirrors 4 and 5, a panel 11 with concentrators 6, an optical or power module 8 with solar cells 7, a transmitter feed or emitter 9, and a transmission subsystem that can include, for example, a reflector or output mirror 10 and one or more other mirrors as necessary. A control system 13 adjusts the shape, position, orientation and alignment of the power system components.

This specification generally refers to adjusting the alignment of system components for purposes of explanation, but the alignment can include a shape, a position, an orientation and other adjustments that can affect the alignment of system components. The system elements are arranged to collect sunlight, generate electrical energy from the collected sunlight, and convert the electrical energy into a form that can be transmitted to a receiver 14 at a pre-determined location 15, such as Earth or another location, where it is converted and distributed to users.

Figure 2A:
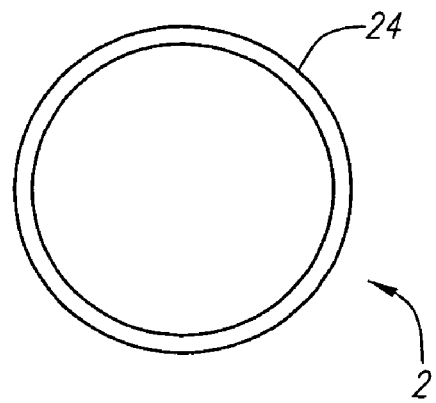
FIGS. 2A-B illustrate plan and cross-sectional views of a collector or primary mirror.
Figure 2B:
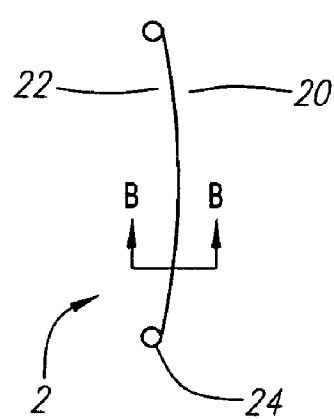

More specifically, the system components are positioned so that sunlight 1 is incident upon the primary mirror 2. The primary mirror 2 can be, for example, a nearly spherical mirror. The primary mirror 2 can be various sizes, e.g., having a diameter of about 1 km to about 2 km. The primary mirror (and other mirrors as described below) can be supported by a structure. For example, referring to FIGS. 2A-B, an inflatable tube or toroid 24 (generally 24) can surround the mirror 2. The tube 24 may be inflated using chemical or gas air tanks or other inflation systems.

Figure 3:
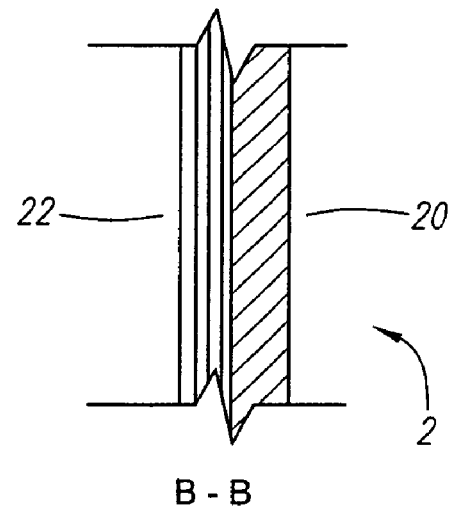
FIG. 3 is a cross-sectional view of coatings on a mirror of the system.
Figure 4A:
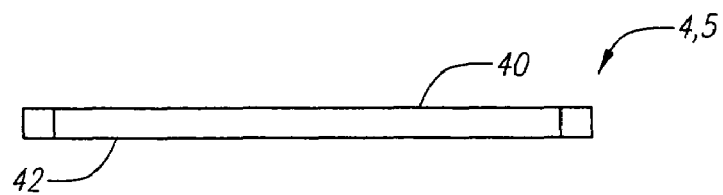
FIGS. 4A-D illustrate different views of mirrors that are supported by an inflatable structure.
Figure 4B:
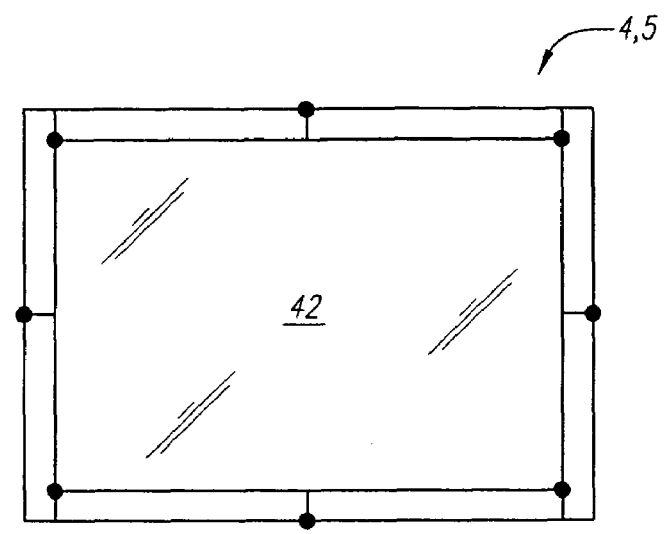
Figure 4C:
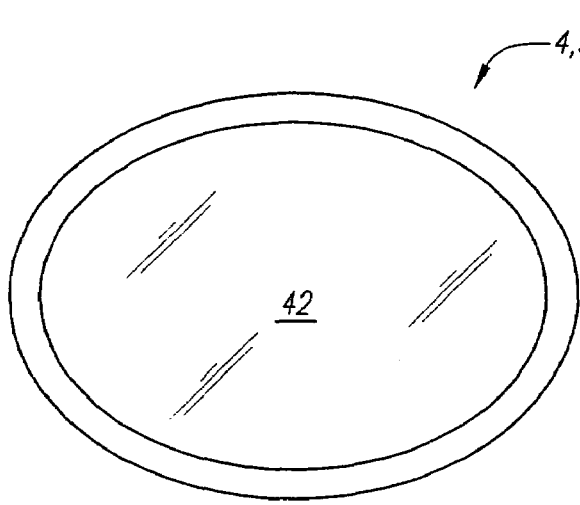
Figure 4D:
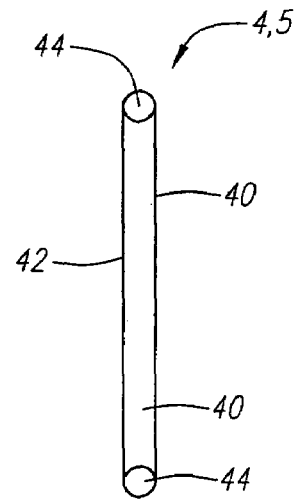

Referring to FIGS. 2 and 3, one embodiment of a primary mirror 2 includes a substrate 20, such as a plastic substrate, that is coated with one or more films or optical coatings 22. The optical coatings reflect selected portions of sunlight 1 (e.g., particular wavelengths) that are most suitable for use by the solar cells 7. The selective reflection also reduces the photon force upon the mirror 2. Persons of ordinary skill in the art will recognize that various suitable substrate and coating combinations can be utilized for different mirror configurations and reflectivity and solar cell requirements.

Referring again to FIG. 1A, the sunlight 1 is reflected by the primary mirror 2 to a first intermediate mirror 4, such as a flat folding mirror. The mirror 4 tracks the orientation of the primary mirror 2 so that the two mirrors 2 and 4 remain in alignment. The first fold mirror 4 reflects the incident sunlight 1 onto a second intermediate mirror 5, such as a fold mirror. The second fold mirror 5 can be identical to the first fold mirror 4 or have another suitable design.

For example, referring to FIGS. 4A-D, a mirror in the space-based power system can be a flat mirror that includes a plastic substrate 40 and a coating 42, e.g., the same coating as the coating 22 on the primary mirror 2. For example, having the same coatings on the mirrors 2, 4, and 5 reduces the heat load on the solar cells 7. The coating 42 also reduces the solar photon pressure on the fold mirror. The mechanical residual stress in the coating can be set to the value needed to counteract the solar photon pressure, and maintain an optically flat surface. FIG. 4 also illustrates that the mirrors can also include inflatable supports 44.

Referring again to FIG. 1A, the mirror 4 rotates about the axis 3, and the mirror 5 tracks the concentrators 6. With proper maneuvering, the first fold mirror 4 reflects the incident sunlight 1 onto the second fold mirror 5. The second mirror 5 reflects light to one or more concentrators 6, such as non-imaging concentrators. The concentrators 6 magnify and smooth out spatial irregularities in the reflected beam of sunlight 1 received from the second fold mirror 5. The output of the concentrators 6 is directed to solar cells 7 of an RF or optical power module 8. Using concentrators allows an entire solar cell wafer to be utilized, resulting in more efficient energy production.

Various concentrator 6 focal lengths can be used to obtain the correct magnification of sunlight onto the solar cells 7 or other conversion devices. For example, the sun typically subtends an angle of approximately 0.5 degree at 1 a.u. (the distance from the sun to the earth). Thus, for example, the size of the focal spot could be 0.00873 times the focal length of the system.

Persons of ordinary skill in the art will recognize that various power modules can be utilized with different embodiments and systems. For example, as shown in the Figures, the power module is a photovoltaic power module that utilizes solar cells. Alternative power modules include turbines, heat engines, and nuclear sources. A further alternative power module is a thermoelectric power module. A thermoelectric power module utilizes a temperature gradient, e.g., warmer front surfaces and cooler rear surfaces, that result in a junction between two surfaces to generate electricity. For purposes of explanation and illustration, but not limitation, this specification refers to photovoltaic power modules with solar cells 7.

In one embodiment, the solar cells 7 are mounted near an input electrode of the modules 8. Thus, electrical cables from the solar cells 7 to the modules 8 are not needed. Eliminating these connectors reduces the mass of the system. Further, power losses in the system are reduced by reducing or eliminating power losses due to resistive ($I^2R$) heating in connecting cables. This arrangement also eliminates the need for other components typically associated with components connectors, such as insulation. Eliminating these components also reduces the weight of the power module, increases the performance of the cells, and reduces the cost of the cells.

The spacing arrangement of the solar cells 7 also allows heat to be conducted to the thermal panels 11, which radiate heat to space. Also, the concentrators 6 provide for dedicated solar cells 7 for each RF or optical power module 8. Thus, the concentrators provide for efficient use of incident sunlight 1. This arrangement is also advantageous since the solar cells are co-located with an energy conversion device, thus reducing the length of or eliminating connectors between these components. Co-location of these components is not practicable in typical known systems using connecting structures because of the need for the concentrator to track the Sun while the RF or optical section remains pointed at the Earth a user's substation.

The concentrators 6 with the fold mirror 5 shield the solar cells 7 from direct view of space and thus protect the solar cells 7. More specifically, the solar cells are mounted on the power module, and the concentrators are mounted above the cells, thus shielding the solar cells from a direct view of space except for a small solid angle centered on the incoming sunlight. The second fold mirror acts as a shield in this last direction so that the solar cells are shielded in all directions, eliminating the need for solar cell cover slips (e.g., glass) and other protective coverings. As a result, the weight of the power system is further reduced by eliminating these components.

DC electrical power generated by the solar cells 7 is converted by the RF or optical power modules 8 into a form that can be transmitted, such as RF or optical power. The RF or optical power is radiated by the RF feeds or optical emitters 9 to the RF reflector, output mirror 10 (generally reflector 10), or directly to the predetermined location. For example, the RF feeds or optical emitters 9 can be arranged in a direct radiating array or a phased array antenna 19 (FIG. 1E), thus eliminating the need for a reflector 10. Waste heat from the solar cells 7, power modules 8, and RF feeds or optical emitters 9 is radiated into space by the thermal panels 11.

The reflector 10 is constructed so that the coating or incident surface reflects power to Earth or another predetermined location or station and transmits sunlight. By transmitting sunlight 1, the photon pressure on the reflector 10 is reduced or nearly eliminated. Since the reflector 10, may be as large as the primary mirror 2, reducing photon pressure results in a significant reduction in fuel that is needed for station-keeping of the reflector 10. However, as with the primary mirror 2, the residual photon pressure, in conjunction with the selected residual mechanical stress of the coating that reflects power and transmits sunlight 1, can be used to maintain the correct shape of the reflecting surface. This arrangement can reduce the weight of the reflector 10, for example, up to about 66% or more. Alternatively, an optical mirror 10 is constructed so that the coating reflects the desired optical wavelengths and transmits unwanted solar radiation.

The RF or optical power 12 reflected by the reflector or mirror 10 can be a diffraction-limited beam that is generally focused and directed to a terrestrial antenna or collector 14 located on Earth or another desired location 15. A set of RF/optical sensors at the antenna or collector measure the beam waveform shape and boresight. A feedback circuit 17 computes aspects of the received beam and send control signals back to the control system to adjust the alignment of one or more components, e.g., adjust the shape, position, or orientation of a component.

For example, if the emitters 9 and reflector 10 are not properly aligned, one or both of these components can be adjusted so that a beam 12 reflected from the reflector 10 is directed towards the receiving antenna 14. As a further example, the shape of the emitters 9 can be adjusted.

The proximity control system 13 or a separate control system is used to adjust the alignment of various power system components, for example, a primary or transmission mirror, an intermediate mirror, such as a fold-mirror, a reflector, a sub-reflector, and an antenna feed. The control system can also maintain the shape of the wave front of the transmitted electromagnetic wave. Other activities that can be performed by the control system include active mirror control, phase conjugation, and active antenna control.

In one embodiment, the control system 13 includes a sensor system and a displacement system to adjust the alignment of one or more system components in response to sensor data. Persons of ordinary skill in the art will recognize that a space-based power system can have different numbers of free-floating system elements. For example, one or more, most, or all of the elements can be free-floating in space. The control system can be configured to adjust the alignment of the free-floating elements, and elements that are not free-floating (e.g., tethered to other elements). This specification, however, refers to the control system aligning free-floating power system elements for purposes of explanation, but not limitation. For example, data from control system elements or sensors, such as radar and lidar sensors, can indicate the alignment of two or more components. The displacement system can include one or more thruster elements that can be activated or de-activated in response to the sensor data to adjust the alignment.

Referring to FIG. 1A, in one embodiment, the proximity control system is located in space and generally includes control units or sensors 2a,b (generally 2a), 4a,b (generally 4a), 5a,b (generally 5a), 8a,b (generally 8a), 10a,b (generally 10a), and thrusters 2d,e (generally 2d), 4d,e (generally 4d), 5d,e (generally 5d), 8d,e (generally 8d), and 10d,e (generally 10d) on respective power system components 2, 4, 5, 8, and 10. The embodiment shown in FIG. 1A is merely illustrative of various proximity control configurations that utilize different numbers and positioning of proximity control system components.

Figure 1B:
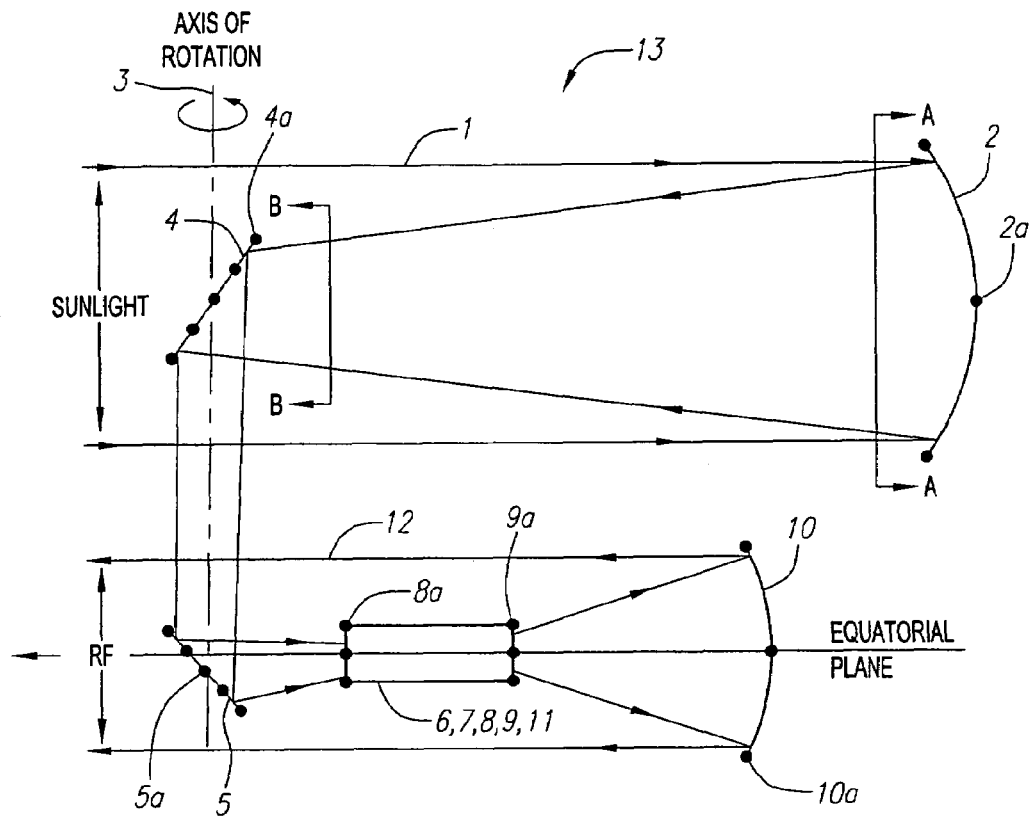
FIGS. 1B-D illustrate views an embodiment of a system to control the positioning and alignment of power system components.
Figure 1C:
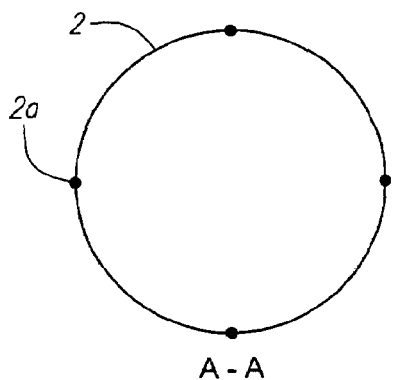
Figure 1D:
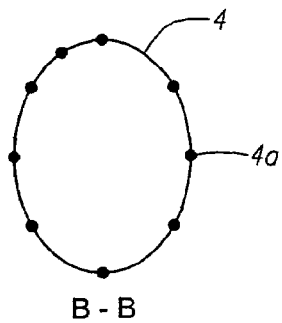
Figure 1E:
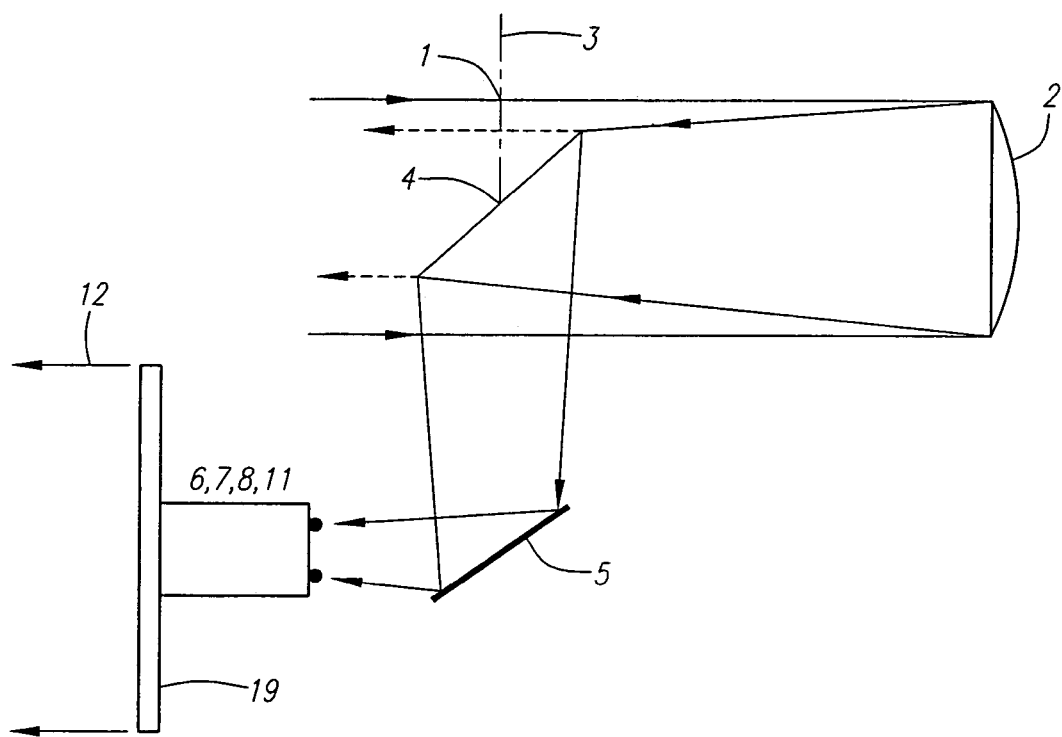
FIG. 1E illustrates an alternative embodiment having a phased array antenna.

For example, referring to FIGS. 1B-D, in another embodiment, the primary mirror 2 includes four sensors, and the intermediate mirrors 4 and 5 include eight sensors. FIGS. 1C and 1D illustrate cross-sectional views showing one possible sensor arrangement. In the illustrated embodiment, four proximity control system sensors 2a on the primary mirror 2 and a corresponding four sensors 4a on the mirror 4 are arranged to look at or communicate with each other. Similarly, four additional proximity control system sensors 4a on the mirror 4 and corresponding four sensors 5a on the mirror 5 are arranged to communicate with each other. Four additional units 5a on the mirror 5 and four units 8a on the module 8 are arranged to communicate with each other. Additionally, four units 9a on the emitters 9 and four units 10a on the reflector 10 are arranged to communicate with each other.

With this configuration, three sensor units can be utilized, with the fourth unit in a group serving as a back-up unit. The fourth unit can also be used to resolve anomalous behavior of other units. Further, if only one sensor unit is utilized, the other three units can be used to cross-check the first unit.

Thus, in the illustrated embodiments, the control system makes adjustments based on communications between sensors of adjacent elements, i.e., elements that communicate with each other by reflecting or receiving sunlight or other signals. For example, the primary mirror 2, fold mirrors 4 and 5, optical module 8 and reflector 10 can all include sensors. The sensors on the mirrors 2 and 4 communicate with each other, the sensors on the mirrors 4 and 5 communicate with each other, the sensors on the mirror 5 and the optical module 8 communicate with each other, and the sensors on the optical module 8 and the reflector 10 communicate with each other. The control circuit is configured to adjust a system component based on the alignment of the previously described pairs of components. Adjustments can be made based on alignments of other numbers and combinations of system components.

Thus, for example, in response to sensor data between mirrors 2 and 4, thrusters on the mirror 4 may be activated (or de-activated) to re-align the mirror 4 with respect to mirror 2. Similarly, thrusters on mirror 2 can be activated (or de-activated). After re-aligning one system component, one or more other system components can also be re-positioned to maintain proper alignment of the entire system. A monitoring system on Earth or another planet, body or station can also monitor and alter the alignment of system components.

In one embodiment, a proximity control system 13 uses complementary and redundant position-measuring devices, such as stereoscopic cameras, modulated laser diodes, and lasers. For example, lasers can form a closed loop of optically coherent beams, such that a change in relative positions and orientation of the system components produce a change in the interference pattern at each of the loop's detectors. Relative motion in a system can also produce Doppler shifts of the light beams that determine direction of motion. These changes and shifts can be used to maintain the relative positions of power system components, e.g., to sub-millimeter accuracies.

In another embodiment, multiple retro-reflectors and optical targets are placed on the circumference of the two concentrators and used for active and passive control. Laser transmitter/receivers and optical sensors are located on the power module, and the first fold mirror can monitor the position and orientation of these structures. The optical sensors can use stereoscopic images to measure precise orientation and approximate range.

Laser beams, such as modulated continuous wave (CW) laser beams, can be reflected from retro-reflectors. The phase of the returned beam can be compared to the phase of the transmitted beam. Pulsed laser beams can be reflected from the retro-reflectors and by measuring the time-of-flight, an independent range can be determined. Also a set of highly coherent CW laser beams can be reflected from retro-reflectors and interferometrically compared with the transmitted beams.

A change of one interference fringe can correspond to a change in range of one quarter wavelength of the laser emission line. Using homodyne detection, Doppler shifting of the beam can produce a beat frequency that is proportional to the rate of range change. Because of the extremely high frequency of the laser light, speeds of one millimeter per second can be measured. Thus, position and radial speed can be measured simultaneously with the proximity control system. Additionally, Charge Coupled Device (CCD) or stereoscopic cameras can be used to obtain spatial and angular measurements and range using stereoscopy of adjacent system components. These devices can also be used to navigate system elements into their initial (approximate) positions.

In an alternative embodiment, the proximity control system 13 uses a solar wind, primarily, and ion thrusters and electrostatic forces secondarily, to maintain the correct positions and orientations of the power system elements. The reflectors and fold mirrors can have paddle-like structures mounted on their circumference. The handle sections of the paddles point in the radial direction (with respect to the mirror) such that the paddles can be rotated with respect to the incident sunlight. By the proper rotation of the paddles, torques and forces can be imparted to the reflectors and fold mirrors. Ion engines can handle residuals that are not eliminated by the paddles. Furthermore, for free-floating elements that are not too distant, loose pseudo-tethers can provide limits and/or allow the use of repulsive-only forces to maintain positions if necessary. Thus, while embodiments of the invention eliminate or reduce connecting structures for aligning system components, they are also adaptable to other configurations, applications and supports. In another embodiment, the proximity control system 13 uses orbits, for example, about the Earth or other celestial body, so that the consumption of station-keeping fuel by the heaviest system elements is minimized. The other elements (e.g. fold mirrors of an optical or RF system) are positioned to maintain focus, alignment, boresight, etc. Since the latter elements are lighter, the station-keeping fuel required by the entire system is reduced. This configuration also provides greater flexibility in positioning reflectors with respect to the power module.

Some components may be close enough that cables can tether them and repulsive electrostatic forces can be used to keep the cables taut.

Additionally, if necessary, the components can have distance or ranging sensors. For example, FIG. 1 illustrates distance sensors 2c, 4c, 5c, 8c, 10c that detect the distance between system components. Various types and numbers of distance sensors can be utilized as needed. If a components falls outside an acceptable range or an orbit, one or more thrusters can be activated to re-position the component within the accepted range.

For example, a modulated laser diode rangefinder can be used to provide a continuous range to adjacent system components by comparing the modulation phase of transmitted and received range signals. As a further example, a pulsed laser rangefinder can provide a continuous range to adjacent system components by measuring the time-of-flight of transmitted and received signals.

FIGS. 5-17 illustrate alternative embodiments of a power system having free-floating elements and how sunlight is captured and processed to produce electric power. The control system sensors and thrusters shown in FIG. 1 are not shown in FIGS. 5-17, however, the previously described components can also be used with the alternative embodiments. Further, the general manner in which the systems or components shown in FIGS. 5-17 is the same or similar to the system shown in FIG. 1. Thus, all of the details regarding generating RF or optical energy with the alternative embodiments are not repeated. Components of alternative embodiments that are the same as or similar to the components shown in FIG. 1 are represented with like reference numbers.

Figure 5:
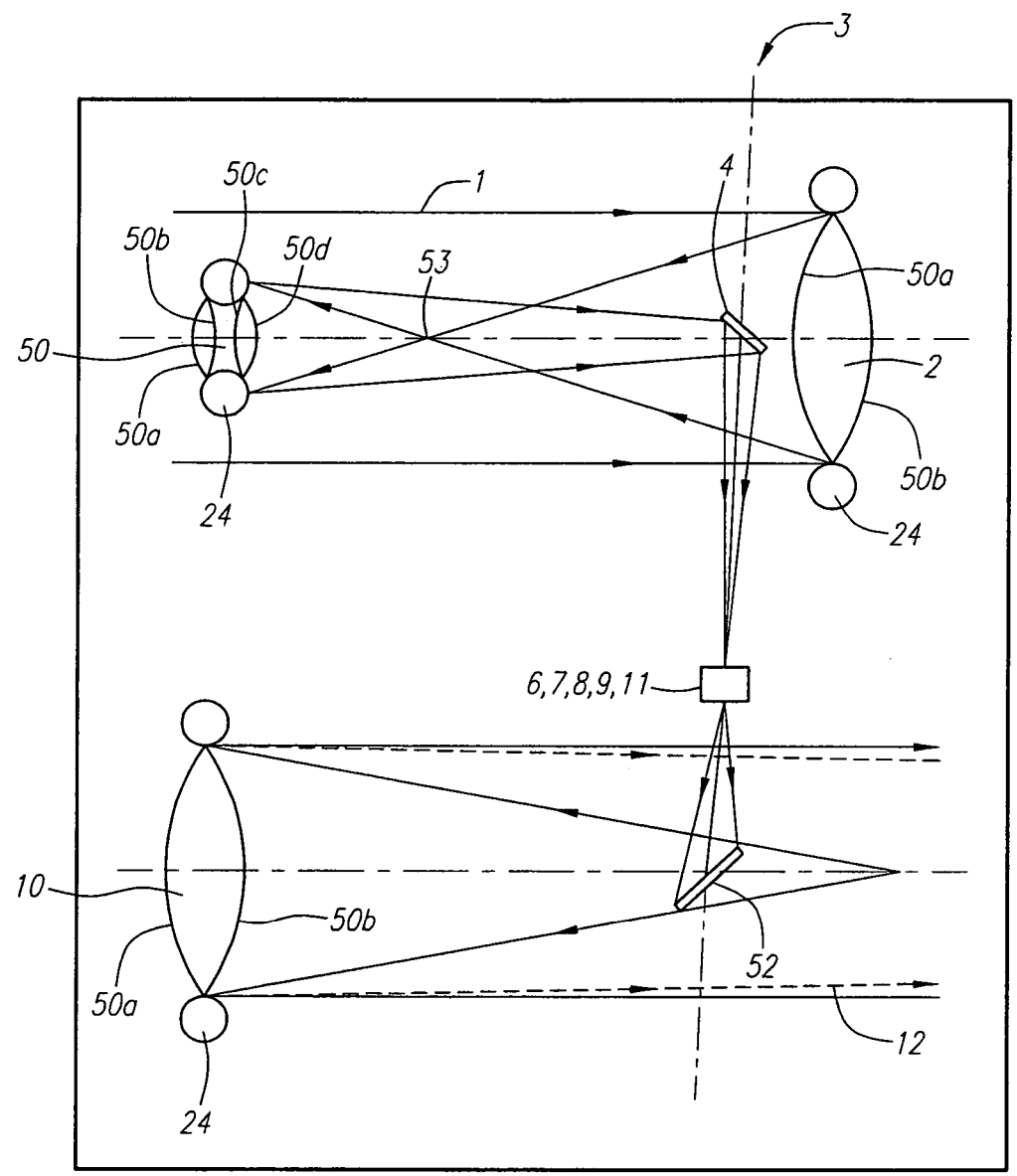
FIG. 5 is an illustration of an embodiment using inflatable mirrors and membrane elements.

Referring to FIG. 5, in one embodiment, a space-based power system includes a lens system that includes parabola and hyperbola shaped lenses, such as a Cassagrain optical system, inflatable mirrors, and membrane support elements. More specifically, the system includes a primary mirror 2, a mirror 50, membranes 50a-d, such as transparent membranes, a first intermediate mirror 4, a module that includes concentrators 6, solar cells 7, an RF or optical module 8, RF transmitter feeds or optical emitters 9, and a thermal panel 11 (as in FIG. 1), a second intermediate mirror 52, and a reflector 10.

The mirror 50 may be an ellipsoid-shaped mirror and is supported by four membranes 50a-d. The mirrors 2 and 10 are supported by two membranes 50a-b. The membranes are used to maintain the proper shape of the mirrors 2, 10 and 50 using appropriate gas pressure. The mirrors are also supported by inflatable tubes or toroids (generally 24). The inflatable toroids can be folded up prior to launch and inflated by gas or chemical air tanks once in orbit.

Sunlight rays 1 are reflected by the mirror 2 to a focus point 53, from which they diverge and impinge on the mirror 50. The mirror 50 relays the image via converging rays to the folding mirror 4. The mirror 4 converges the rays to a magnified and even more blurred focus (e.g., now 0.34 km diameter), onto solar cell array surfaces 7 of the optical module 8.

For example, in one embodiment, solar concentrator 6 paraboloids can be approximately 2.25 km in diameter, of focal length 4.125 km, and f-number of 1.8. Similarly paraboloids used for transmitting microwaves can have a diameter of 2.25 km, a focal length of 5.975 km, and f-number of 2.6. In both of these selected cases, the focal spot size of the sun at the first focus 53 of the primary mirror solar collectors would be about 36 meters.

DC electrical power generated by the solar cells 7 is converted into RF or optical power by the RF or optical power module 8. The larger blur size of the generated energy beam is intended to match the dimensions of the surface of the array and provide quasi-equal illumination.

The energy emanating from the module 8 is directed to the fold mirror 52. The fold mirror 52 is similar to a fold mirror 4 or 5 except that the mirror 5 is configured to reflect sunlight, whereas the mirror 52 is configured to reflect RF or optical energy. The fold mirror 52 directs the energy to the reflecting mirror 10, e.g., having a parabolic shape. The energy arrives at parabolic surface of the mirror 10 via expanding rays and reflects the output beam 12 to the pre-determined location, e.g., Earth or a space station. As shown in FIG. 5, the beam 12 reflected by the mirror 10 in this system is a substantially parallel beam or a diffraction-limited beam.

Figure 6:
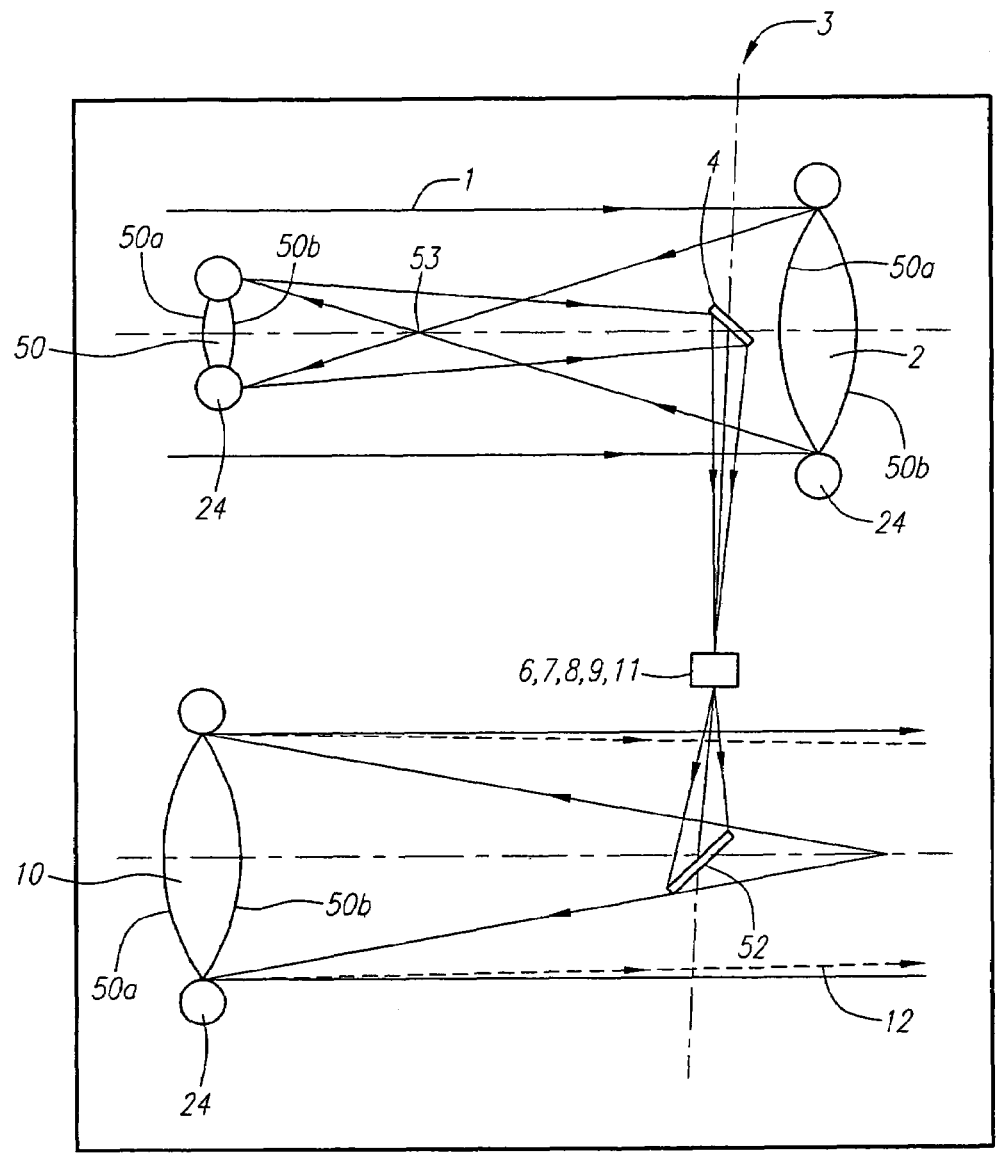
FIG. 6 is an illustration of an embodiment using inflatable mirrors and membrane elements.

FIG. 6 illustrates a further alternative embodiment that utilizes an optical system that is similar to the system shown in FIG. 5. In this embodiment, the mirrors are supported by two membranes, whereas the mirror 50 is supported by four membranes as shown FIG. 1.

Figure 7:
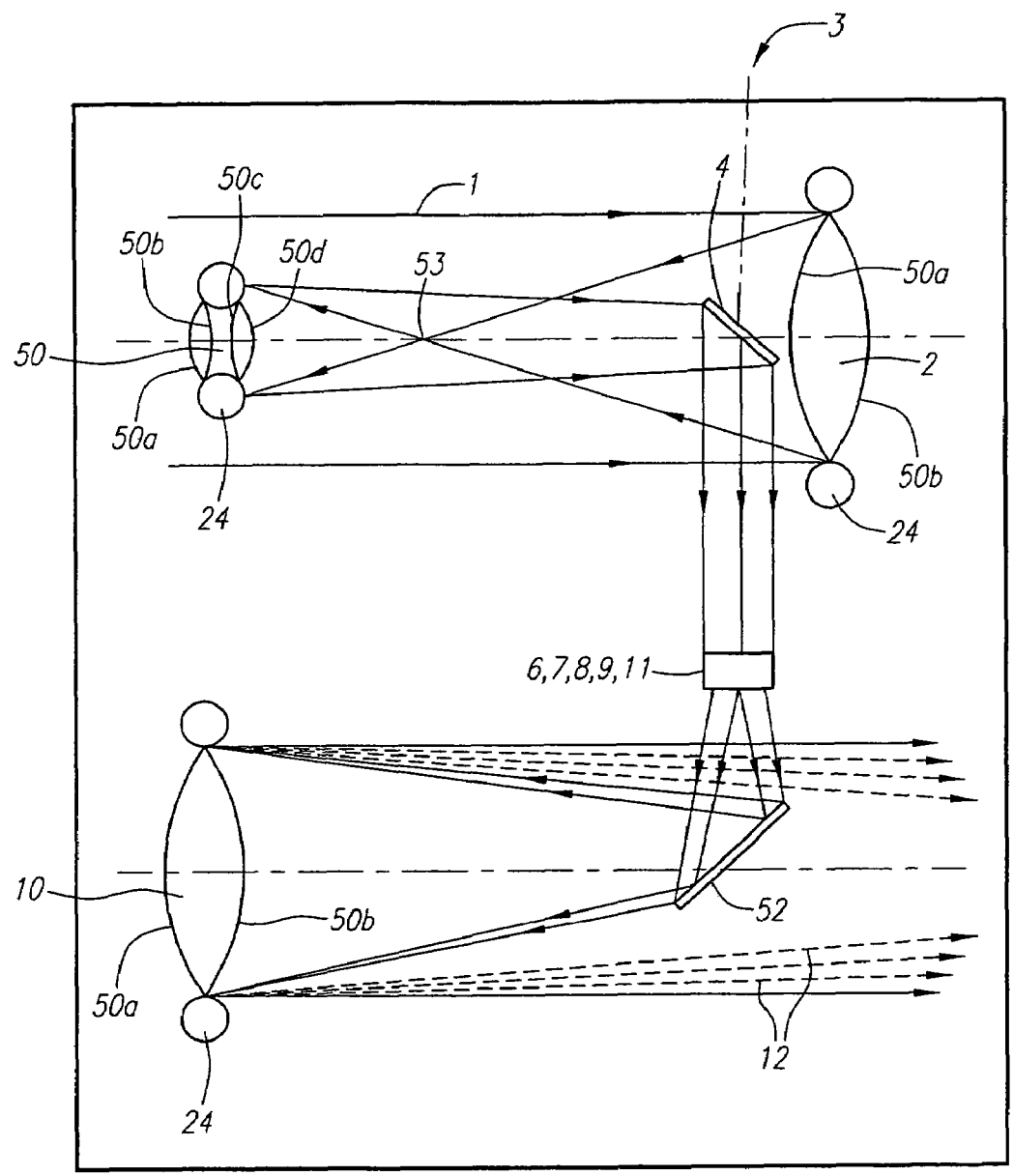
FIG. 7 is an illustration of an embodiment using inflatable mirrors and membrane elements.

Referring to FIG. 7, an alternative embodiment of a space-based power system includes an optical system, such as a Coude optical system, inflatable mirrors, and four-membrane secondary elements. The components are configured so that rays of sunlight arrive and fall collimated onto the solar cell array surface 7 of the optical module 8. Further, the mirror 10 reflects the rays to a "spot" or a more focused point on the earth's surface compared to the systems shown in FIGS. 5 and 6.

Figure 8:
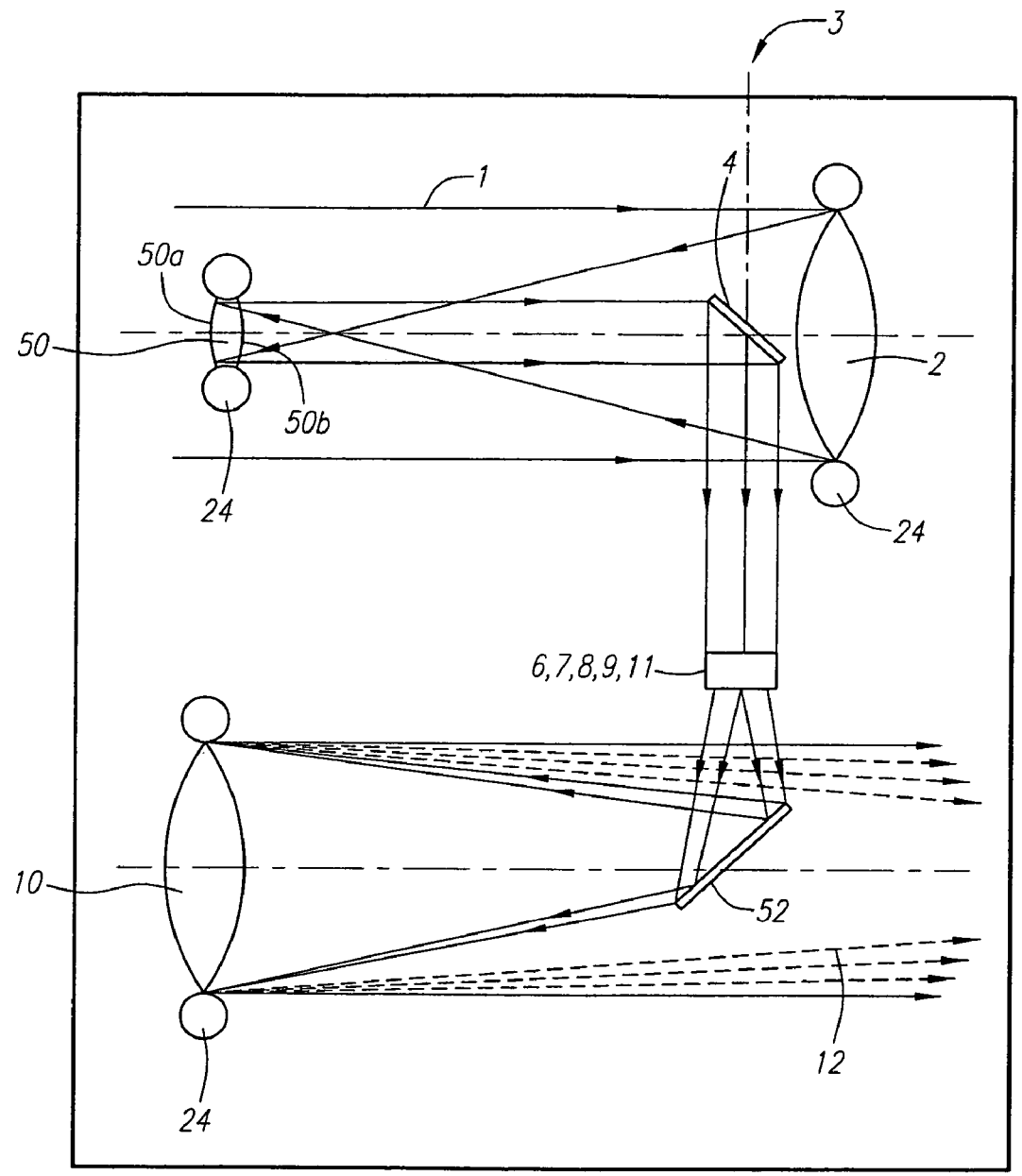
FIG. 8 is an illustration of a further embodiment using inflatable mirrors and membrane elements.

FIG. 8 illustrates a further alternative embodiment. This embodiment utilizes a configuration that is similar to that shown in FIG. 7, except that the system shown in FIG. 8 utilizes two membranes 50a,b to support each mirror.

The embodiments shown in FIGS. 5-8 operate in a similar manner as the embodiment shown in FIG. 1A except that other embodiments use, for example, different membrane systems and optical components.

The previously described space power gathering, converting and transmitting systems are compound cooperative, in that the gathering and transmitting elements and the conversion module have a common axis of rotation. This arrangement allows various "horizontal" angles to be utilized, between the sending and receiving elements of each system, to point one element at the sun and one towards the earth during various seasonal orbital situations. Further rotation of one element's optical axis plane about the optical axis of other elements allows precision pointing of the "vertical" axis of the transmitter to various locations on the earth, while holding the collector positioned on the sun.

Figure 9:
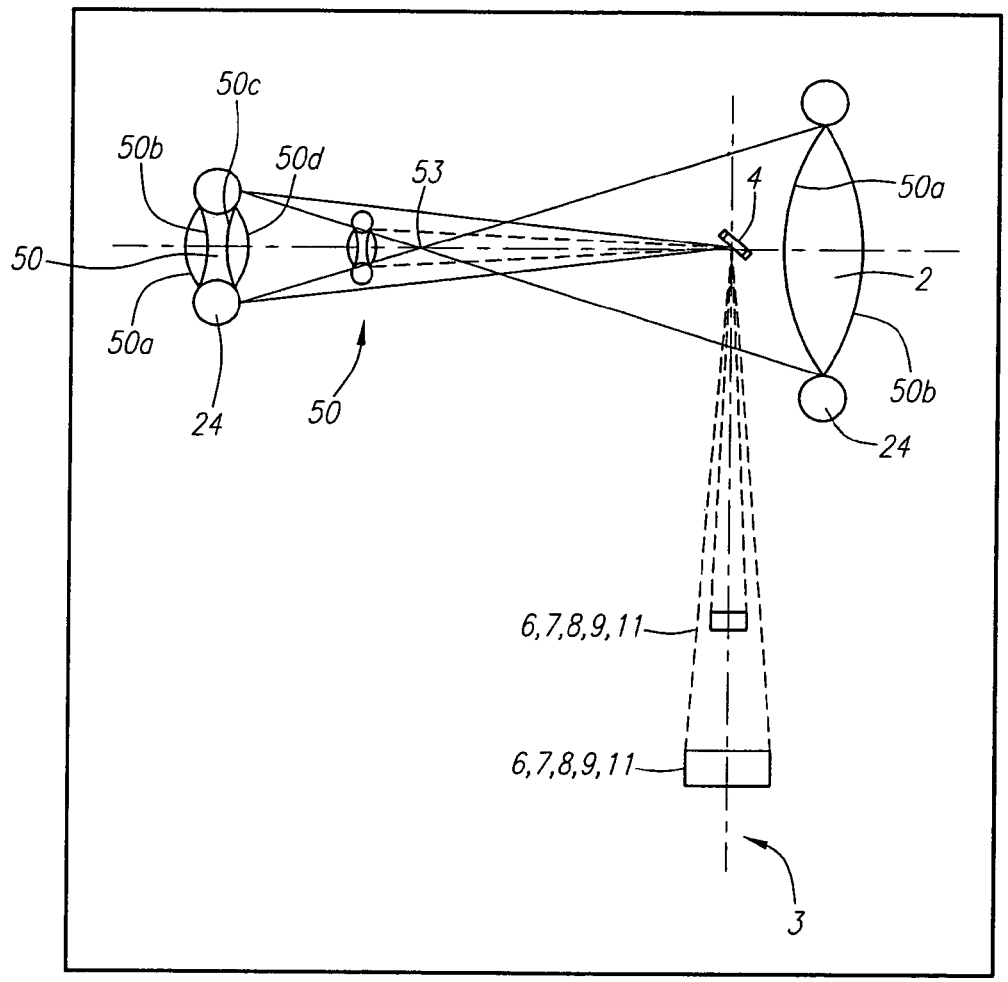
FIG. 9 is an illustration of an embodiment of a generation subsystem having a photovoltaic power module and solar concentrators.
Figure 10:
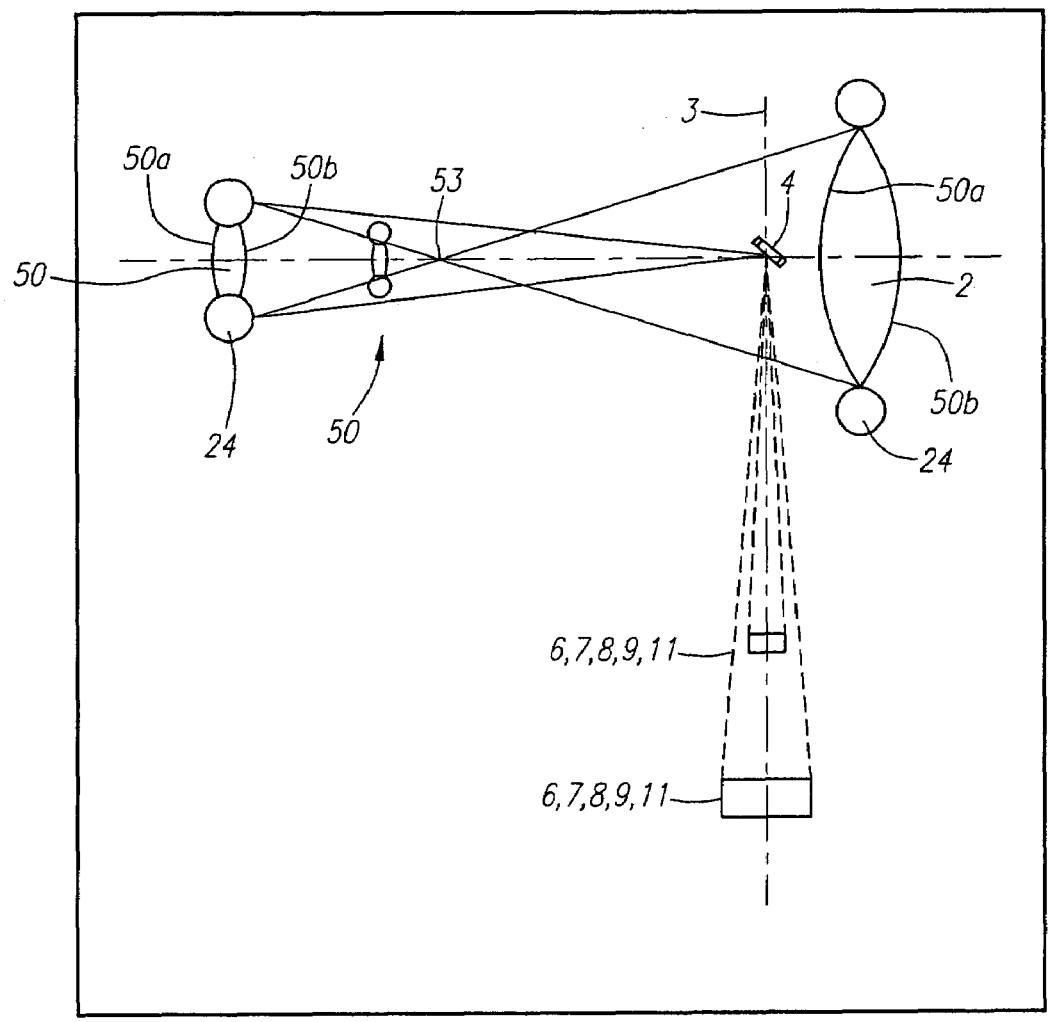
FIG. 10 is an illustration of an embodiment having a photovoltaic power module and multiple solar concentrators.

FIGS. 9-10 illustrate embodiments of a power generation subsystem. The wireless transmission subsystem components are not shown in FIGS. 9 and 10, however, various transmission subsystems can be utilized, including the previously described subsystems and the subsystems shown in FIGS. 12 and 13.

Embodiments of the generation subsystems of FIGS. 9 and 10 include inflatable mirrors, membranes, and multiple concentrators. In particular, the embodiments include a reflective mirror 2, a pair of mirrors 50, an intermediate mirror 4, and a pair of modules having a concentrator 6, solar cells 7, an RF or optical module 8, RF transmitter feeds or optical emitters 8, and a thermal panel 11 (as in FIG. 1). Four support membranes 50a-d support both of the mirrors 50 in the embodiment shown in FIG. 9, whereas two support membranes 50a,b support the mirrors 50 in the embodiment shown in FIG. 10. In both embodiments, the mirror 2 includes two support membranes 50a,b, one of the mirrors 50 is larger than the other mirror 50, and one of the modules (6,7,8,9,11) is larger than the second module. DC electricity generated by the solar cells and output by the emitters 8 is processed as previously described.

Figure 11:
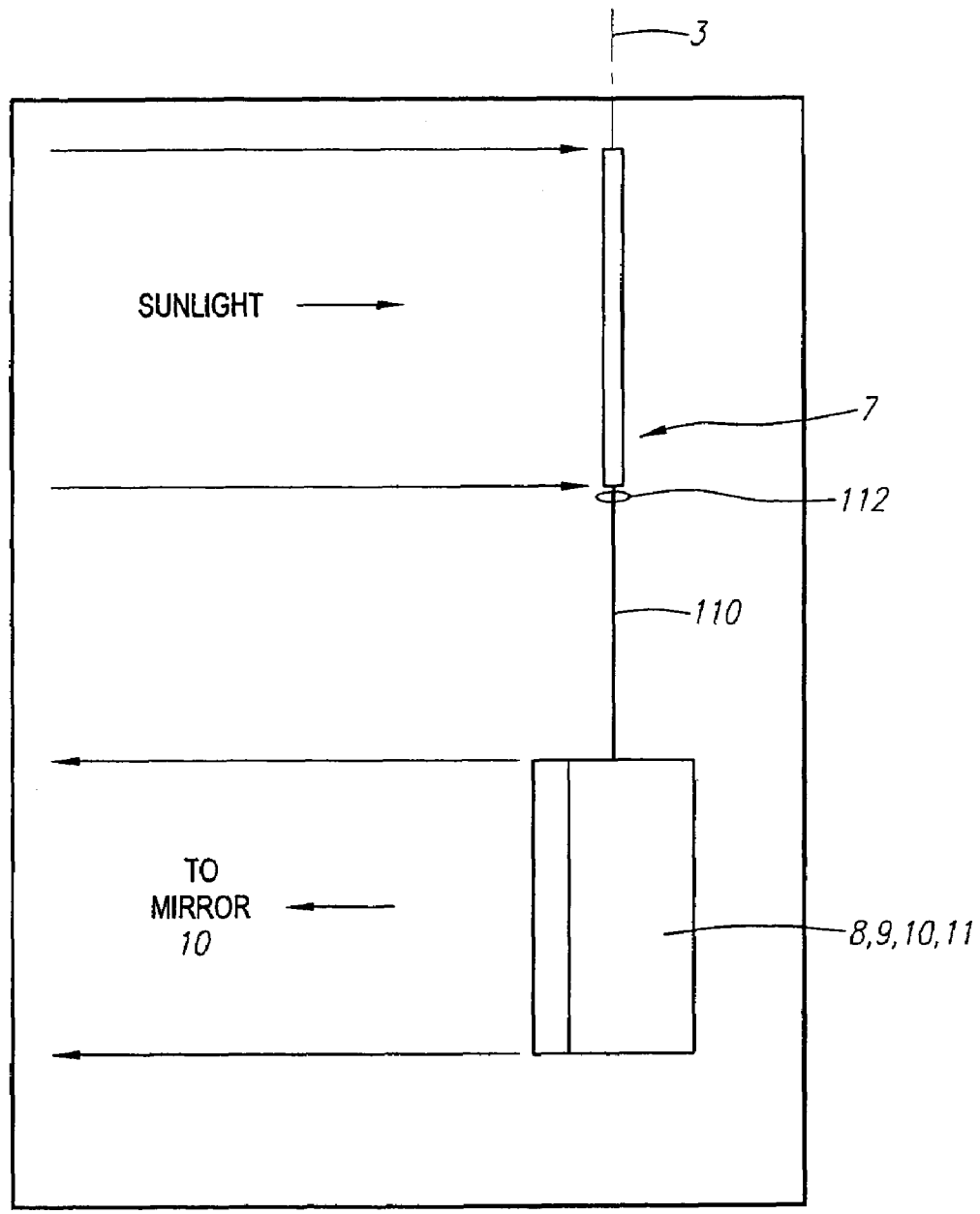
FIG. 11 is an illustration of an embodiment of a generation subsystem having a power cable to connect solar cells and photovoltaic module components.

Referring to FIG. 11, in another embodiment, a power generation subsystem can be configured without concentrators. Thus, the module 8, emitter 9, reflector 10 and panel components can be integrated together and connected via a power cable 110 and an electrical slip ring 112 or other suitable coupling to the solar cells 7. When sunlight is incident upon the solar cells, the DC electricity generated by the solar cells is provided to the module (8,9,10,11) via the cable 110. The module converts the DC electricity into RF or optical power, and the emitters 9 provide the RF or optical power output to the phased-array antenna 19.

Figure 12:
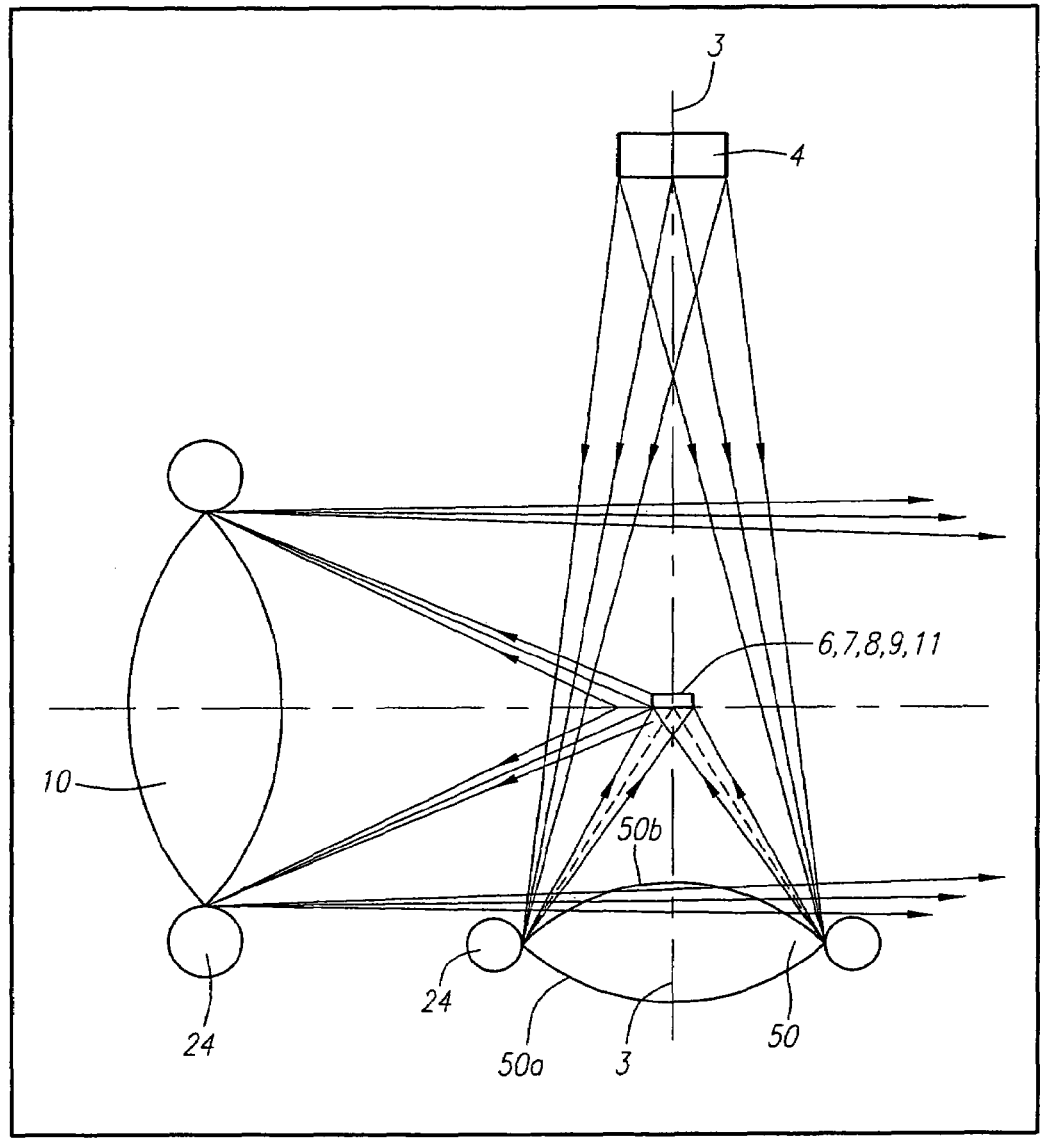
FIG. 12 illustrates an embodiment of a wireless transmission system.
Figure 13:
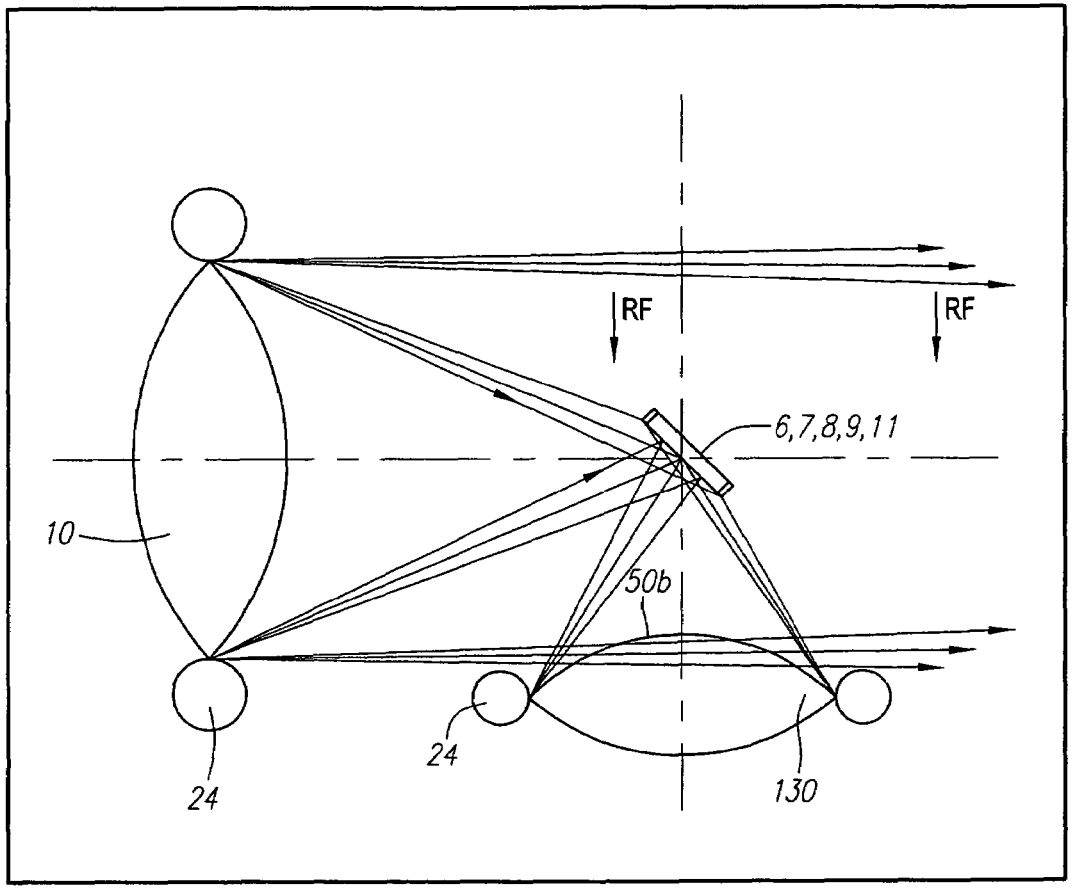
FIG. 13 illustrates another embodiment of a wireless transmission system.

FIGS. 12 and 13 illustrate embodiments of wireless transmission subsystems that transmit RF or optical energy generated by a power generation subsystem. Various generation subsystems can be utilized, including the previously described generation subsystems.

Referring to FIG. 12, one embodiment of a transmission subsystem utilizes a mirror 4 and a concentrator system that is orthogonal to the direction of the output beam 12. Sunlight reflected from a mirror 4 is directed to an inflatable mirror 50 that is supported by two membranes 50a and 50b. The mirror 50 reflects the incident rays to a module having a concentrator 6, solar cells 7, module 8, emitters 9 and panel 11. The solar cells generate DC electricity, which is converted to RF or optical power by the emitters 9. The output of the emitters 9 is directed to a reflector 10, such as an inflatable mirror, which is also supported by membranes and reflects the output beam 12.

The embodiment shown in FIG. 13 is configured for RF and utilizes a RF mirror element 130. More specifically, RF that is incident upon element 130 is reflected to a module having concentrators 6, solar cells 7, module 8, emitters 9 and panel 11. DC electricity generated by the solar cells 7 is converted by the module 8 into RF energy. The emitters 9 output the RF energy to the mirror 10, which reflects the output beam 12.

Figure 14:
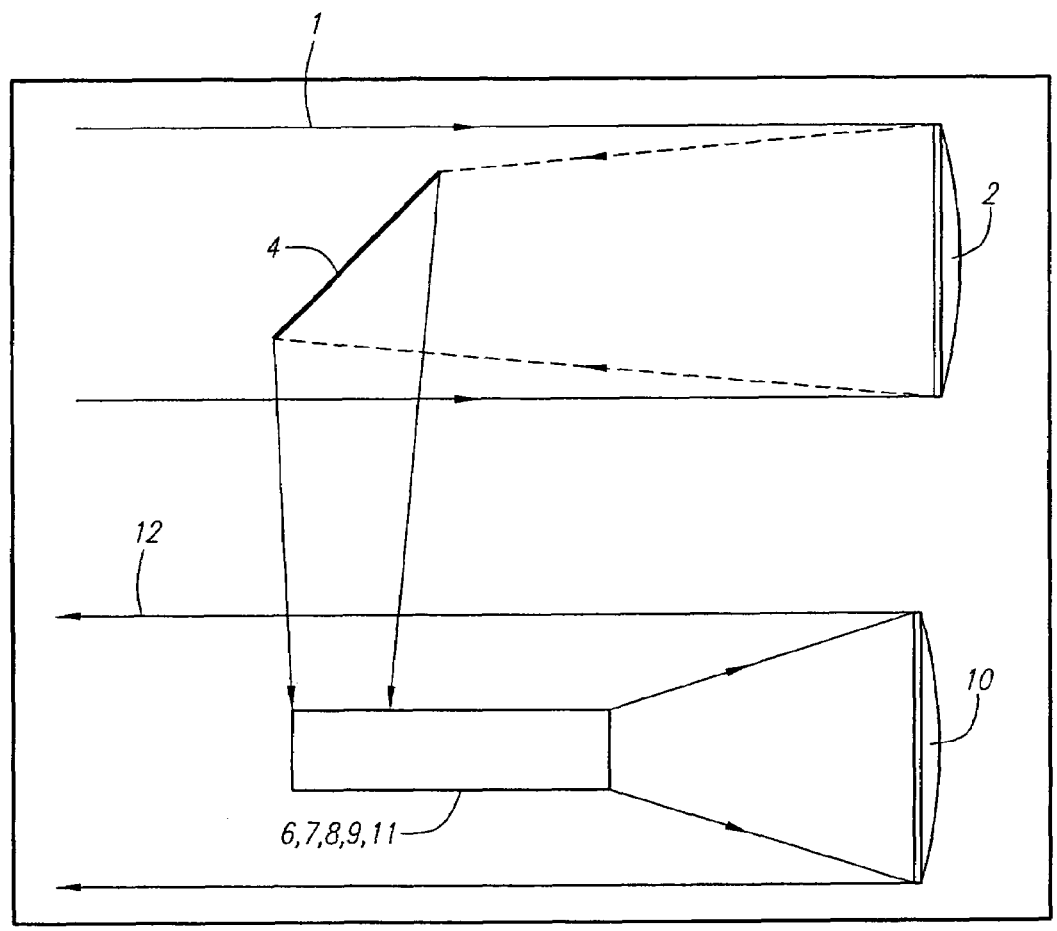
FIG. 14 illustrates an embodiment of a space-based power system having a mirror and a power module that provides an output directly to a reflecting mirror.

FIGS. 14-17 illustrate additional embodiments of space-based power system configurations. For example, FIG. 14 illustrates a configuration in which a single mirror 4 is configured to reflect sunlight 1 directly from the primary mirror 2 to the concentrators 6 and the solar cells 7, rather than reflecting sunlight indirectly to the concentrators utilizing a second intermediate mirror. The output of the emitters 9 is provided to the reflector 10, which reflects the output beam 12.

Figure 15:
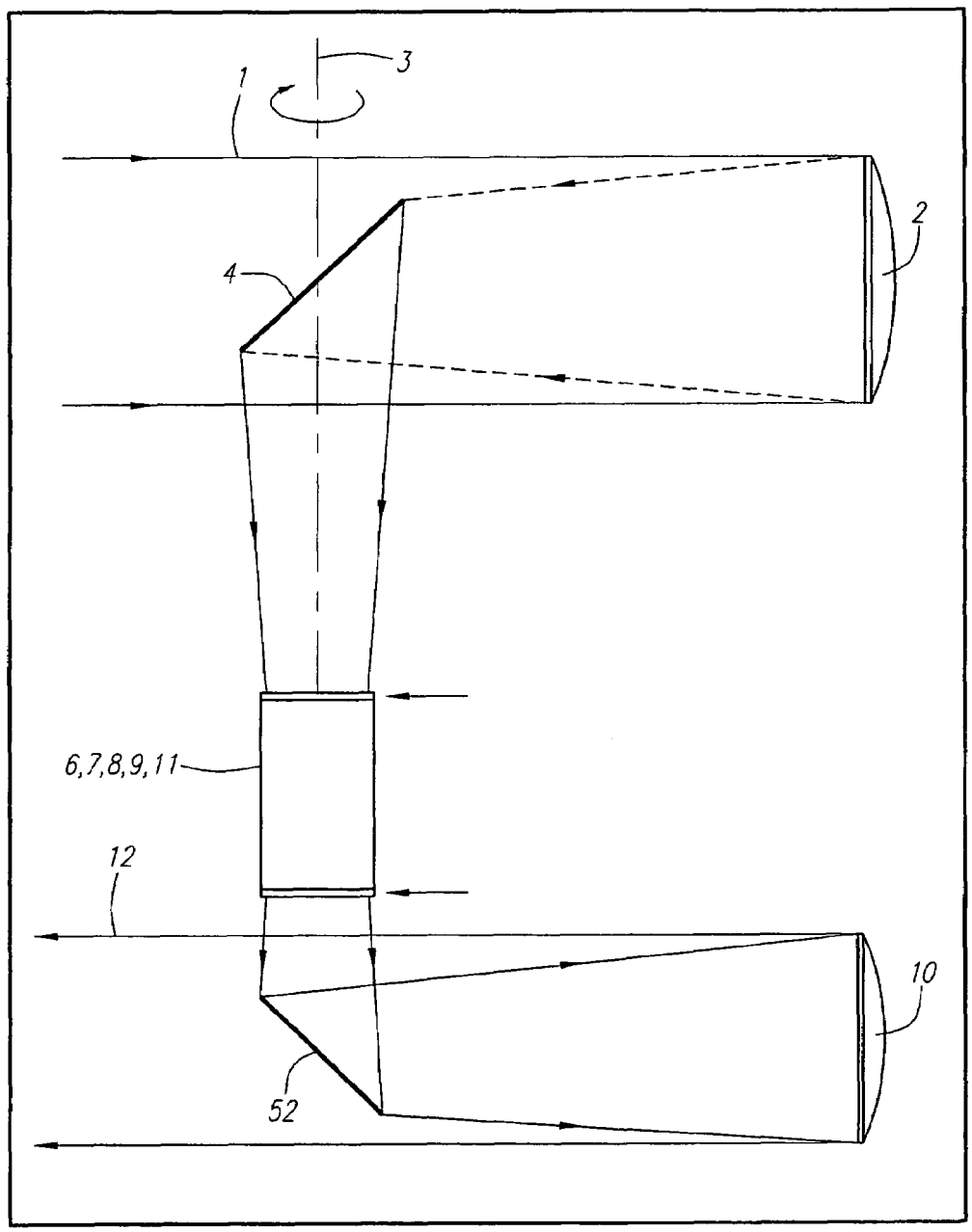
FIG. 15 shows an embodiment of a space-based power system having a power module that is positioned between intermediate mirrors.

FIG. 15 illustrates a configuration that is similar to the configuration shown in FIG. 1, except that the module having components 6,7,8,9 and 11 is placed between the first and second mirrors 4 and 52. Thus, the RF or optical beam output by the emitters 9 is reflected by the second mirror 52, which reflects the beam to the reflector 10, which generates the output beam 12.

Figure 16:
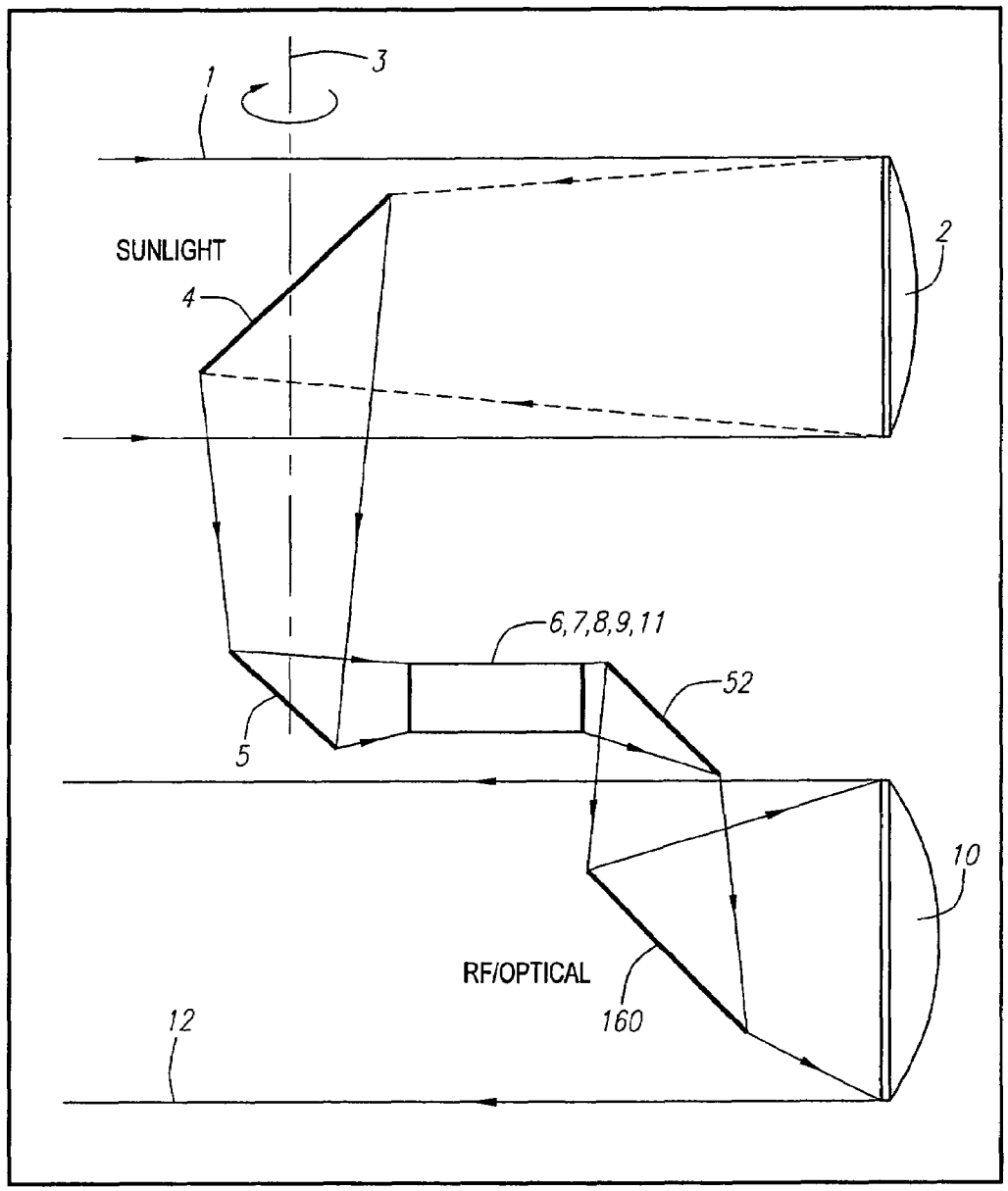
FIG. 16 illustrates an embodiment of a space-based power system having two intermediate mirrors in each of the generation and transmission subsystems.

FIG. 16 illustrates a configuration in which the generation and wireless subsystems each include two intermediate mirrors, such as fold mirrors. More specifically, the generation subsystem includes a primary mirror 2, and intermediate mirrors 4 and 5, such as fold mirrors. The sunlight is reflected from the second mirror 5 to the module having the solar cells 7 that generated DC electricity. The emitters convert the DC electricity into an RF or optical beam, that is output to a mirror 52, which reflects the beam to a mirror 160. The mirror 160 reflects the beam to the mirror 10, which reflects the output beam 12.

Figure 17:
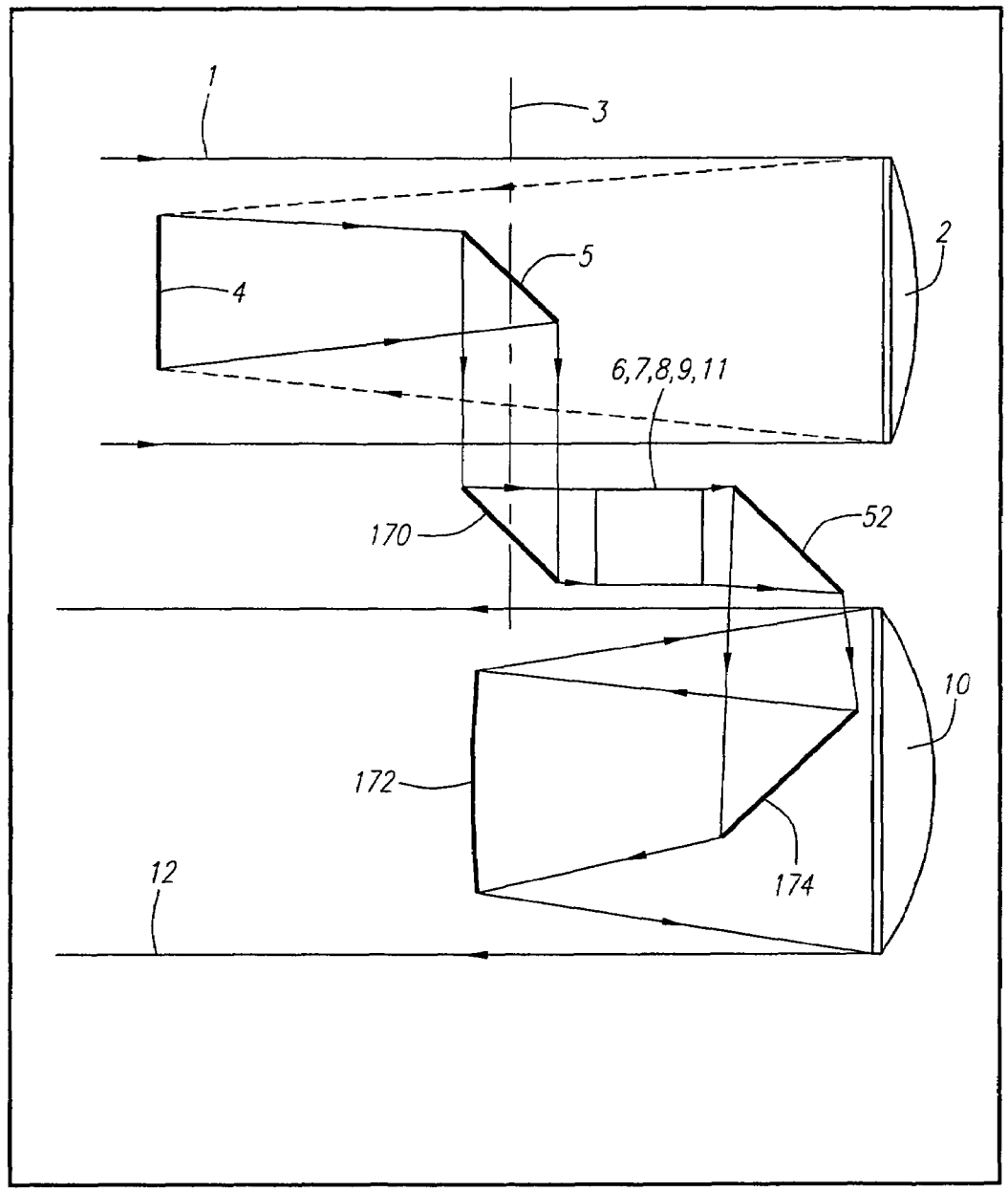
FIG. 17 illustrates an embodiment of a space-based power system having three intermediate mirrors in each of the generation and transmission subsystems.

FIG. 17 illustrates an embodiment in which the generation and wireless subsystems each include three intermediate or fold mirrors. More specifically, the generation subsystem includes intermediate mirrors 4, 5, and 170, and the transmission subsystem includes intermediate mirrors 52, 172 and 174. Incident sunlight 1 is reflected from the mirror 2, to mirror 4, to mirror 5, to mirror 170 to the solar cells 7. The cells generate DC electricity, and emitters 9 convert the DC electricity into an RF or optical beam, that is output to a mirror 52, which reflects the beam to mirror 172, to mirror 174 and then to reflector mirror 10, which provides the output beam 12.

Having described various aspects and embodiments of a space-based power system, generation subsystems and transmission subsystems, persons of ordinary skill in the art will appreciate that the described and illustrated embodiments are advantages over known systems.

For example, the connecting structures between system components are eliminated, thereby significantly reducing the weight of the system. Further, the free-floating system elements are aligned without using rigid connecting structural elements. Rather, these elements are free-flying and positioned and oriented using a proximity control system.

Additionally, the spaced-based power system can be applied to various power station sizes, configurations and locations. For example, the space-based power system can be applied to a 1 GW power station situated in geostationary earth orbit (or any other orbit of need about any heavenly body of interest).

Additionally, since the elements of the illustrated embodiments are independent of each other (e.g. free-flying objects under the control of the proximity control system), the major structures (solar collector and the RF or optical transmission system) can be placed in orbits selected to minimize station-keeping fuel requirements of the system. The smaller fold-mirrors can be flown in other orbits, keeping the entire system in alignment and focus. Thus, the flexibility of the embodiments allows for reducing on-orbit fuel consumption.

Moreover, since the elements are free-flying, under the control of the proximity control system, failed elements can be moved out of position, and replacement elements can be moved into position. This flexibility simplifies the need for on-orbit module replacements and costly downtime. Failed system elements can also be placed in a parking orbit nearby so that, if in the future, repair or use for another mission is feasible, they will be readily available.

The space-based power system also enables the construction of large structures in space, specifically making the construction of a power station in geostationary earth orbit practicable, while overcoming shortcomings of prior systems that typically rely on heavy connecting structures. The elements of the system can also be precisely positioned, oriented and shaped without using large amounts of station-keeping fuel or structures.

The system provides an additional advantage of reducing photon pressure on the primary mirror 2 as a result of the selective reflection by the coating 2a. More specifically, the mechanical residual stress in the coating is set to counteract the solar photon pressure, and maintain an optically flat surface. The selective reflection may, reduce the solar photon pressure on the primary mirror by, for example almost 50%. To further reduce the heat load on the solar cells 7, the first fold mirror 4 can have the same coating as the primary mirror 2.

Further, by using large aperture optics, the need for a large solar array or a "farm" of many smaller collectors is no longer needed. Rather, a large reflector can collect and concentrate sunlight onto a much smaller solar array.

Persons of ordinary skill in the art will appreciate that various sizes, materials, shapes, and forms of optical elements can be used for other system configurations. Further, persons of ordinary skill in the art will appreciate that embodiments can use various frequencies including RF, infrared, and optical frequencies.

The system components can also be assembled in different manners. For example, the components can be flown to space separately, in its own orbit. The pointing direction of the components can then be adjusted for alignment with other system components.

Additionally, the embodiments can be utilized in different locations and environments. For example, power can be provided to various space and terrestrial locations including, but not limited to, the earth, the moon, other planets, space stations, space vehicles, and satellites. Similarly, the proximity control system can control the position of power system components from various locations, e.g., from the Earth, the moon, other planets, space stations, space vehicles and satellites. The embodiments can also be configured with different numbers of mirrors, membranes, concentrators and other components. Further, different numbers of power elements of a system can be free floating. For example, depending on a particular configuration or application, a few, most or all of the power system components can be free-floating or free of connectors.

Certain insubstantial modifications, alterations, and substitutions can be made to the described embodiments without departing from the scope of the invention, as recited in the accompanying claims.

What is claimed:

1. A space-based power system, comprising:
a plurality of free-floating power system elements in space, each free-floating power system element in space being separated from and not connected or tethered to another power system elements in space, the plurality of free-floating power system elements including a free-floating intermediate power system element that receives sunlight from one power system element in space and transmits the sunlight to another power system element in space; and
a control system having a plurality of control system elements, each power system element having a control system element so that power system elements can be aligned based on communications between control system components,
the plurality of power system elements being arranged to collect sunlight, generate electrical energy from the collected sunlight, and convert the electrical energy into a form for transmission to a pre-determined location.

2. The system of claim 1, at least one power system element being a mirror.

3. The system of claim 1, the predetermined location comprising a planet, a space station, a satellite or a moon.

4. The system of claim 1, the plurality of power system elements including:
a primary mirror;
an intermediate mirror, wherein the primary mirror reflects sunlight to the intermediate mirror;
a power module, wherein the intermediate mirror directs sunlight to the power module, and the power module generates electrical energy;
an emitter; and
a reflective mirror,
wherein the emitter converts the generated electrical energy into a form that can be transmitted, and the converted energy is provided to the reflective mirror, wherein the reflective mirror is configured to transmit the converted energy to a receiver at the predetermined location.

5. The system of claim 4, the power module comprising a photovoltaic module.

6. The system of claim 5, wherein solar cells of the photovoltaic module are co-located with the emitter.

7. The system of claim 1, wherein the control system adjusts a position, an orientation or a shape of a power system element.

8. The system of claim 1, wherein the control system maintains the alignment of all of the plurality of power system elements.

9. The system of claim 1, wherein the control system includes a displacement element that is selectively activated to adjust a power system element in space.

10. The system of claim 1, wherein the control system includes a plurality of sensors, wherein data of sensors of two power system elements is compared to determine whether the power system elements are properly aligned.

11. The system of claim 10, wherein sensors of adjacent power system elements are arranged to communicate with each other.

12. The system of claim 1, wherein a majority of the power system elements are free-floating in space.

13. The system of claim 1, wherein all of the power system elements are free-floating in space.

14. A space-based power system, comprising:
a plurality of free-floating power system elements in space, each free-floating power system element in space being separated from and not connected or tethered to another power system element in space, the plurality of free-floating power system elements including a free-floating intermediate power system element that receives sunlight from one power system element in space and transmits the sunlight to another power system element in space; and
a control system including a plurality of sensors and displacement elements, each power system element having a sensor and a displacement element, the power system elements being aligned based on communications between sensors and by selectively activating one or more displacement elements, the plurality of power system elements being arranged to collect sunlight, generate electrical energy from the collected sunlight, and convert the electrical energy into a form for transmission to a pre-determined location.

15. The system of claim 14, at least one power system element being a mirror.

16. The system of claim 14, the predetermined location comprising a planet, a space station, a satellite, or a moon.

17. The system of claim 14, the plurality of power system elements including:
a primary mirror;
a first intermediate mirror, wherein the primary mirror reflects sunlight to the intermediate mirror;
a power module, wherein the first intermediate mirror directs sunlight to the power module, and the power module generates electrical energy;
an emitter; and
a reflective mirror,
wherein the emitter converts the generated electrical energy into a form that can be transmitted, and the converted energy is provided to the reflective mirror, wherein the reflective mirror is configured to transmit the converted energy to a receiver at the predetermined location.

18. The system of claim 17, the power module comprising a photovoltaic module.

19. The system of claim 18, wherein solar cells of the photovoltaic module are co-located with the emitter.

20. The system of claim 14, wherein the control system adjusts a position, an orientation or a shape of a power system element.

21. The system of claim 14, wherein the control system maintains the alignment of all of the plurality of power system elements.

22. The system of claim 14, wherein sensors of adjacent power system elements are arranged to communicate with each other.

23. The system of claim 14, wherein a majority of the power system elements are free-floating in space.

24. The system of claim 14, wherein all of the power system elements are free-floating in space.

25. A method of controlling free-floating power system elements to generate power in space and transmit the generated power to a predetermined location, the method comprising:

launching a plurality of power system elements and a control system into space, each power system element including an element of the control system, wherein a plurality of power system elements are free-floating in space, each free-floating power system element being separated from and not connected or tethered to another power system element in space;

positioning the plurality of power system elements in space so that a free-floating intermediate power system element in space receives sunlight from one power system element in space and transmits the sunlight to another power system element in space; and maintaining alignment of the power system elements based on communications between control system elements so that the power system elements are configured to collect sunlight, generate electrical energy from the collected sunlight, and convert the electrical energy into a form suitable for transmission to the pre-determined location.

* * * * *